(12) United States Patent
Shiraishi et al.

(10) Patent No.: US 9,470,741 B2
(45) Date of Patent: Oct. 18, 2016

(54) PRINTED BOARD, ELECTRONIC CONTROL APPARATUS AND INSPECTION METHOD OF PRINTED BOARD

(71) Applicant: DENSO CORPORATION, Kariya, Aichi-pref. (JP)

(72) Inventors: Ryoichi Shiraishi, Okazaki (JP); Toru Itabashi, Anjo (JP); Yuki Mikami, Kariya (JP); Akihiro Yanagisawa, Toyohashi (JP)

(73) Assignee: DENSO CORPORATION, Kariya (JP)

( * ) Notice: Subject to any disclaimer, the term of this patent is extended or adjusted under 35 U.S.C. 154(b) by 333 days.

(21) Appl. No.: 14/190,250

(22) Filed: Feb. 26, 2014

(65) Prior Publication Data

US 2014/0239973 A1    Aug. 28, 2014

(30) Foreign Application Priority Data

Feb. 28, 2013  (JP) ................................. 2013-038360

(51) Int. Cl.
  *G01R 31/07*  (2006.01)
  *H05K 1/02*   (2006.01)
  *H01H 85/046* (2006.01)

(52) U.S. Cl.
  CPC ............. *G01R 31/07* (2013.01); *H05K 1/0268* (2013.01); *H01H 85/046* (2013.01); *H05K 1/0263* (2013.01); *H05K 2201/10181* (2013.01)

(58) Field of Classification Search
  CPC ...................................................... H02H 5/04
  See application file for complete search history.

(56) References Cited

U.S. PATENT DOCUMENTS

| | | | |
|---|---|---|---|
| 8,773,833 B2 * | 7/2014 | Itabashi | H05K 1/0293 361/104 |
| 2007/0278615 A1 * | 12/2007 | Kushiyama | G11C 17/18 257/529 |
| 2012/0200970 A1 | 8/2012 | Itabashi et al. | |
| 2012/0200974 A1 | 8/2012 | Mikami et al. | |
| 2014/0307359 A1 | 10/2014 | Mikami et al. | |

FOREIGN PATENT DOCUMENTS

| | | |
|---|---|---|
| JP | S64-28885 A | 1/1989 |
| JP | 5-41567 A | 2/1993 |
| JP | 5-259589 A | 10/1993 |
| JP | H08-70165 A | 3/1996 |
| JP | H11-101841 A | 4/1999 |
| JP | 2007-311467 A | 11/2007 |

OTHER PUBLICATIONS

U.S. Appl. No. 14/190,249, filed Feb. 26, 2014, Mikami et al.
(Continued)

*Primary Examiner* — Tung X Nguyen
*Assistant Examiner* — Feba Pothen
(74) *Attorney, Agent, or Firm* — Posz Law Group, PLC (57) ABSTRACT

A printed board includes an insulated base, a wiring pattern, and an inspection interrupting portion. The wiring pattern is disposed on a first surface of the insulated base, and includes a wiring portion, a land, and an interrupting portion disposed between the wiring portion and the land. The inspection interrupting portion is made of a same material with the interrupting portion and has a same pattern with the interrupting portion. In order to assure an interrupting performance of the interrupting portion, the inspection interrupting portion is inspected instead of the interrupting portion by applying an inspection current to the inspection interrupting portion.

10 Claims, 5 Drawing Sheets

(56) References Cited

OTHER PUBLICATIONS

U.S. Appl. No. 14/190,210, filed Feb. 26, 2014, Itabashi et al.
U.S. Appl. No. 14/190,297, filed Feb. 26, 2014, Kamiya et al.
U.S. Appl. No. 14/190,280, filed Feb. 26, 2014, Murowaki et al.
U.S. Appl. No. 14/190,299, filed Feb. 26, 2014, Itabashi et al.
Office Action mailed Jun. 30, 2015 in the corresponding JP application No. 2013-038360 (English translation attached).

* cited by examiner

PRINTED BOARD, ELECTRONIC CONTROL APPARATUS AND INSPECTION METHOD OF PRINTED BOARD

CROSS REFERENCE TO RELATED APPLICATION

This application is based on Japanese Patent Application No. 2013-038360 filed on Feb. 28, 2013, the disclosure of which is incorporated herein by reference.

TECHNICAL FIELD

The present disclosure relates to a printed board, an electronic control apparatus including the printed board on which electronic components are mounted, and an inspection method of the printed board.

BACKGROUND

JP 2007-311467 A discloses a printed board having a wiring fuse that is provided by a part of a wiring pattern. Hereinafter, the wiring fuse provided by a part of the wiring pattern is also referred to as an interrupting portion of the wiring pattern.

The interrupting portion has a width smaller than a width of a remaining portion of the wiring pattern. Hereinafter, the remaining portion of the wiring pattern is a portion other than the interrupting portion in the wiring pattern. Thus, for example, when an overcurrent that is caused by a short circuit occurred in an electronic component flows through the wiring pattern, the interrupting portion melts down by heat generated by the overcurrent and the overcurrent is interrupted.

Usually, the wiring pattern is formed by coating a conductive paste on a surface of a board. Specifically, the wiring pattern is formed by patterning a metal foil or by a screen printing. Usually, the metal foil has a variation in a thickness. Thus, when the wiring pattern is formed by patterning the metal foil, the interrupting portion of the wiring pattern has a variation in a thickness. Further, when a plating is carried out on the metal foil, a variation in a plating thickness is greater than the variation in the thickness of the metal foil. Thus, the interrupting portion has a greater variation in the thickness. When the wiring pattern is formed by the screen printing, a variation in an applied pressure during the screen printing causes a variation in a coating thickness, and the variation in the coating thickness causes the variation in the thickness of the interrupting portion. As well known, an interrupting performance of the interrupting portion is substantially affected by the variation in the thickness of the interrupting portion.

Conventionally, the interrupting performance of the interrupting portion is assured by inspecting a width of the interrupting portion with an optical visual inspection apparatus. Thus, it is hard to assure the interrupting performance of the interrupting portion with a high precision. Further, the thickness of the interrupting portion is hard to be inspected by the visual inspection apparatus. In order to inspect the thickness of the interrupting portion, an additional thickness measuring apparatus may be used to measure thicknesses at multiple points of the interrupting portion. However, the thickness measuring apparatus needs a high cost and the inspection process needs a longer time.

SUMMARY

In view of the foregoing difficulties, it is an object of the present disclosure to provide a printed board in which an interrupting performance of an interrupting portion is assured with a high precision and an inspection time of the interrupting performance is reduced. It is another object of the present disclosure to provide an electronic control apparatus including the printed board in which an interrupting performance of an interrupting portion is assured with a high precision and an inspection time of the interrupting performance is reduced. Further, it is another object of the present disclosure to provide an inspection method of a printed board in which an interrupting performance of an interrupting portion of the printed board is assured with a high precision and an inspection time of the interrupting performance is reduced.

According to a first aspect of the present disclosure, a printed board includes an insulated base having a first surface and a second surface opposite to the first surface, a wiring pattern, and an inspection interrupting portion. The wiring pattern is disposed on the first surface of the insulated base, and includes a wiring portion, a land, and an interrupting portion. On the land, an electronic component is soldered, and the electronic component mounted on the land and the wiring pattern configures a circuit. The interrupting portion is disposed between the wiring portion and the land. The interrupting portion electrically interrupts the wiring portion from the land by melting down under a heat generated by an overcurrent. The inspection interrupting portion is disposed on at least one of the first surface or the second surface of the insulated base, and is made of a same material with the interrupting portion and has a same pattern with the interrupting portion. The interrupting portion has a width smaller than a width of a remaining portion that is other than the interrupting portion in the wiring pattern. In order to assure an interrupting performance of the interrupting portion, the inspection interrupting portion is inspected instead of the interrupting portion by applying an inspection current to the inspection interrupting portion.

With the above printed board, the interrupting performance of the interrupting portion is assured with a high precision and an inspection time of the interrupting performance is reduced.

According to a second aspect of the present disclosure, an electronic control apparatus includes the printed board according to the first aspect and the electronic component mounted on the land of the printed board by soldering.

With the above apparatus, the interrupting performance of the interrupting portion is assured with a high precision and an inspection time of the interrupting performance is reduced.

According to a third aspect of the present disclosure, an inspection method of the printed board according to the first aspect includes performing a current applying inspection to the inspection interrupting portion by applying the inspection current to the inspection interrupting portion, confirming whether the inspection interrupting portion melts down under the inspection current; and determining the interrupting performance of the interrupting portion based on a result of the current applying inspection performed to inspection interrupting portion.

With the above inspection method, the interrupting performance of the interrupting portion is assured with a high precision and an inspection time of the interrupting performance is reduced.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

The following will describe embodiments of the present disclosure with reference to accompanying drawings. In the following embodiments, same or equivalent parts have the same reference symbol.

(First Embodiment)

Figure 1:
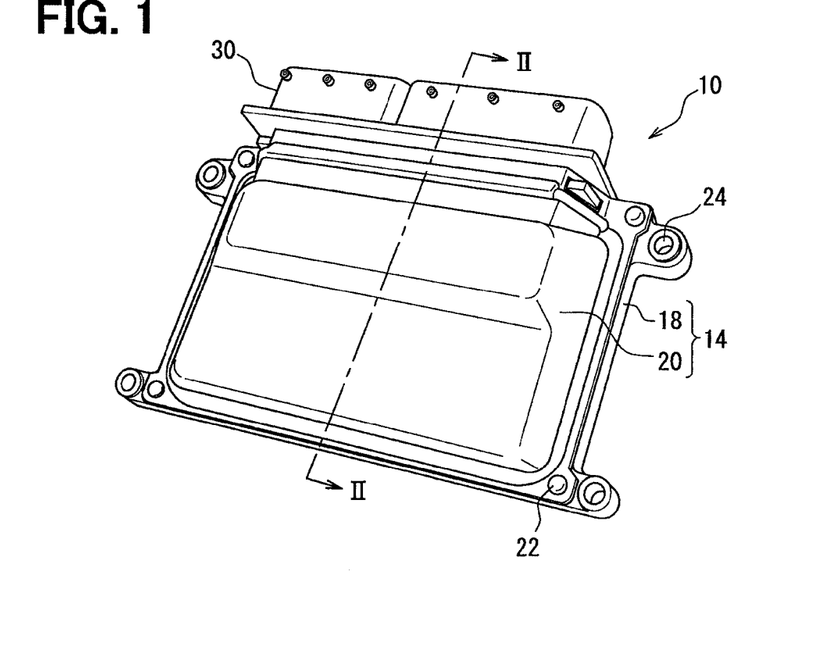
FIG. 1 is a diagram showing a perspective view of a configuration of an electronic control apparatus according to a first embodiment of the present disclosure.
Figure 2:
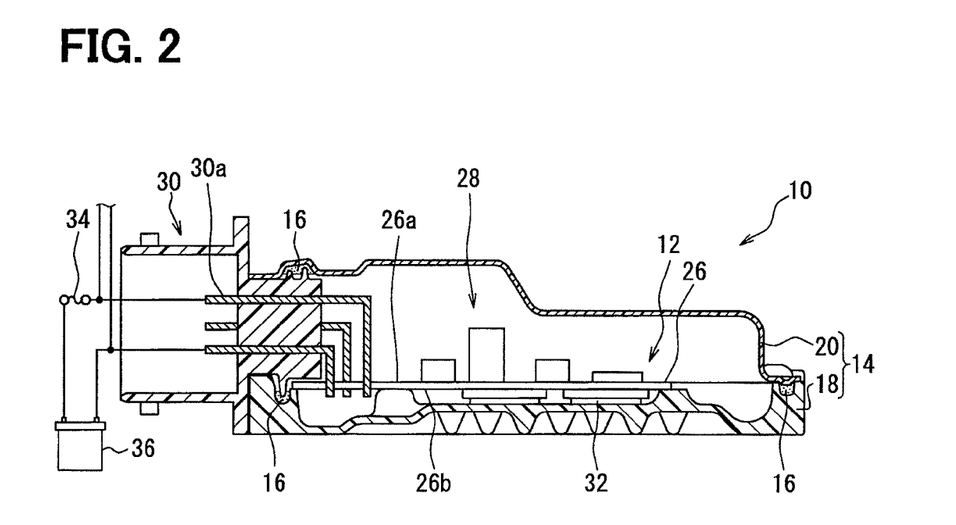
FIG. 2 is a diagram showing a cross-sectional view of the electronic control apparatus in a line II-II in FIG. 1.

As shown in FIG. 1 and FIG. 2, an electronic control apparatus 10 includes a circuit board 12. Further, the electronic control apparatus 10 includes a housing 14 that houses the circuit board 12, and a sealing member 16. In the present embodiment, the electronic control apparatus 10 configures a waterproof electronic control unit (ECU) that controls an engine of a vehicle.

The following will describe a configuration of the electronic control apparatus 10 with reference to FIG. 1 and FIG. 2.

The housing 14 is made of metal, such as aluminum or iron, or resin material. The housing 14 houses the circuit board 12 in order to protect the circuit board 12. The housing 14 may be configured by single structural member or multiple structural members. The number of the structural members configuring the housing 14 is not limited to a predetermined number.

As shown in FIG. 1 and FIG. 2, in the present embodiment, the housing 14 includes two structural members including a case 18 and a cover 20. The case 18 is formed to have a shallow box shape with one opening on a surface. The cover 20 seals the opening of the case 18. When the cover 20 is assembled with the case 18 by, for example, screws 22, an inside space that houses the circuit board 12 is defined by the cover 20 and the case 18. Further, a part of the circuit board 12 is directly or indirectly supported at a predetermined inside position of the housing 14 by the case 18 and the cover 20 in a state that the cover 20 is assembled with the case 18.

Further, a separation direction of the cover 20 from the case 18 is not limited to a predetermined direction. In the present embodiment, the housing 14 is separated into two structural members in a direction along a thickness of the circuit board 12. That is, the housing 14 is separated into the cover 20 and the case 18 in the direction along the thickness of the circuit board 12.

As shown in FIG. 1, the case 18 has through holes 24 at four corners, and screws for fixing the electronic control apparatus 10 to a target, such as an engine block, are inserted to the through holes 24. Further, the housing 14 has an opening for exposing a part of a connector 30 to outside.

The sealing member 16 prevents invasion of moisture into the inside space of the housing 14. As shown in FIG. 2, the sealing member 16 is arranged between a part of a periphery portion of the case 18 and a part of a periphery portion of the cover 20. The part of the periphery portion of the case 18 is opposed to the part of the periphery portion of the cover 20. Further, the sealing member 16 is also arranged between a part of the housing 14 and a part of the connector 30, which are opposed to each other.

In the circuit board 12, multiple electronic components 28 including a microcomputer, a power transistor, a resistor, a capacitor are mounted on a printed board 26. The multiple electronic components 28 and a wiring pattern 40 disposed on the printed board 26 configure an electric circuit. The printed board 26 includes a first surface 26a and a second surface 26b that is opposite to the first surface 26a. The electronic components 28 are disposed at least one of the first surface 26a or the second surface 26b of the printed board 26. As shown in FIG. 2, in the present embodiment, the electronic components 28 are disposed on both the first surface 26a and the second surface 26b of the printed board 26.

Further, the connector 30 electrically connects the circuit configured by the circuit board 12 to an external device, and is equipped to the printed board 26. As shown in FIG. 2, the connector 30 has multiple pins 30a that are inserted into the printed board 26 so that the connector 30 is equipped to the printed board 26. Further, the connector 30 may be mounted on one of the surfaces 26a, 26b of the printed board 26. Further, the connector 30 may be equipped to the printed board 26 with a different method.

As shown in FIG. 2, the electronic control apparatus 10 further includes a heat releasing gel 32. The heat releasing gel 32 is arranged between a part of a surface of the electronic component 28 and a part of an inside surface of the case 18 so that the heat releasing gel 32 is in contact with the electronic component 28 and the case 18. The heat releasing gel 32 releases heat generated by the electronic component 28 to the case 18.

The electronic control apparatus 10 having above-described configuration is electrically connected with a wiring harness. Specifically, an external connector (not shown) is connected with the pins 30a of the connector 30 in order to connect the electronic control apparatus 10 to the wiring harness. Further, the electronic control apparatus 10 is electrically connected to a battery 36 (direct current power source) via a fuse 34 that protects the electronic control apparatus 10 from an overcurrent. The battery 36 also supplies power to other electronic control apparatuses (not shown). Hereinafter, the electronic control apparatus 10 having above-described configuration may also be referred to as a subject electronic control apparatus 10 in order to differentiate from other electronic control apparatuses. Other electronic control apparatuses may include, for example, a brake ECU, a steering ECU, a body ECU, and a navigation device.

The fuse 34 is disposed on a power supply path through which electric power is supplied from the battery 36 to the multiple electronic control apparatuses and the subject electronic control apparatus 10. Thus, the fuse 34 has a high interrupting rating (current), such as 15 amperes (A) or 20 A. The fuse 34 melts down when a malfunction occurs in one of the multiple electronic control apparatuses and the subject electronic control apparatus 10. Specifically, when a malfunction occurs in one of the multiple electronic control apparatuses and the subject electronic control apparatus 10, an overcurrent higher than a current in a proper operating state is generated, and the fuse 34 melts down by the overcurrent. Thus, the fuse 34 interrupts the power supply to all of the electronic control apparatuses including the subject electronic control apparatus 10.

Figure 4:
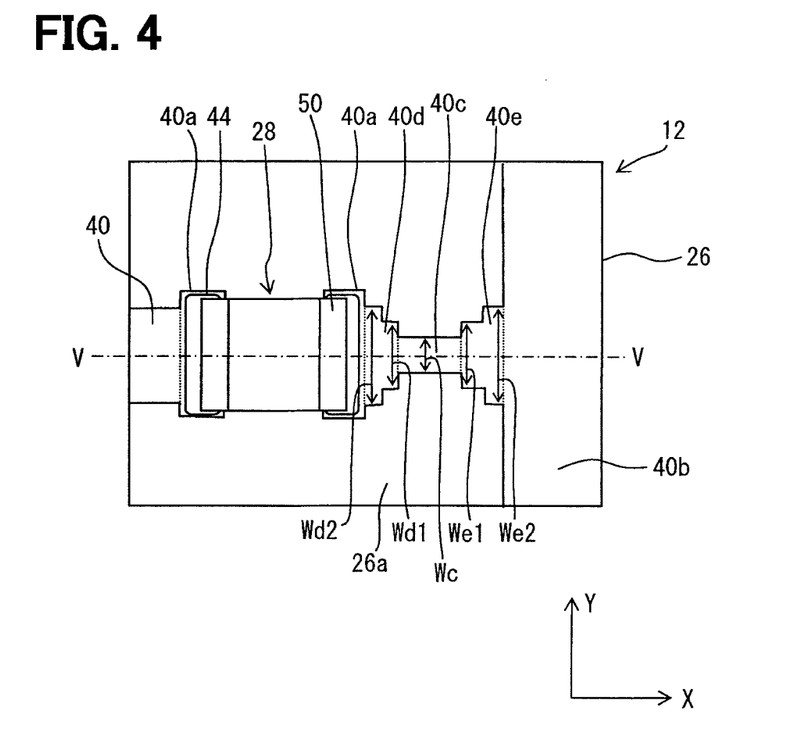
FIG. 4 is a diagram showing an enlarged plan view of a part of the printed board shown by a dashed line IV in FIG. 3.
Figure 6:
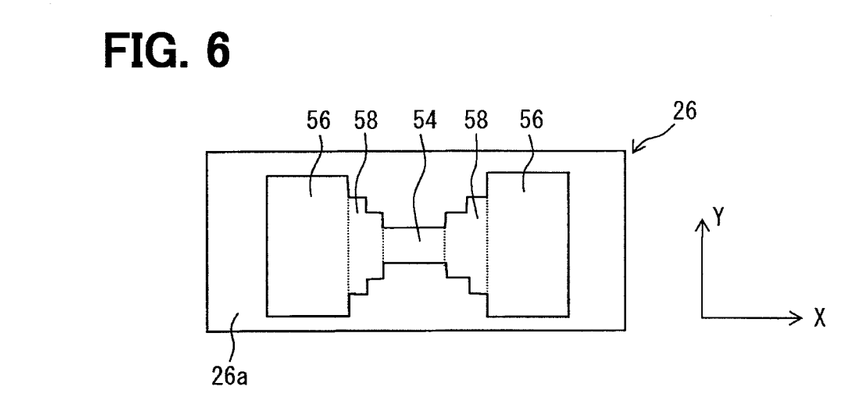
FIG. 6 is a diagram showing an enlarged plan view of a part of the printed board shown by a dashed line VI in FIG. 3.

The following will describe a configuration of the circuit board 12. FIG. 4 and FIG. 6 shows the circuit board 12 with a resist 42 omitted. The circuit board includes one or more electronic components 28 and the printed board 26. On the printed board 26, a plane perpendicular to a direction along a thickness of the printed board 26 is defined as a reference plane. On the reference plane, two directions perpendicular to each other are defined as a direction X and a direction Y. The wiring pattern 40 extends in a direction. A length of the wiring pattern 40 along a direction perpendicular to the direction in which the wiring pattern 40 extends is defined as a width of the wiring pattern 40.

The following will describe the electronic components 28 and the printed board 26 except an inspection interrupting portion 54 of the printed board 26.

Figure 3:
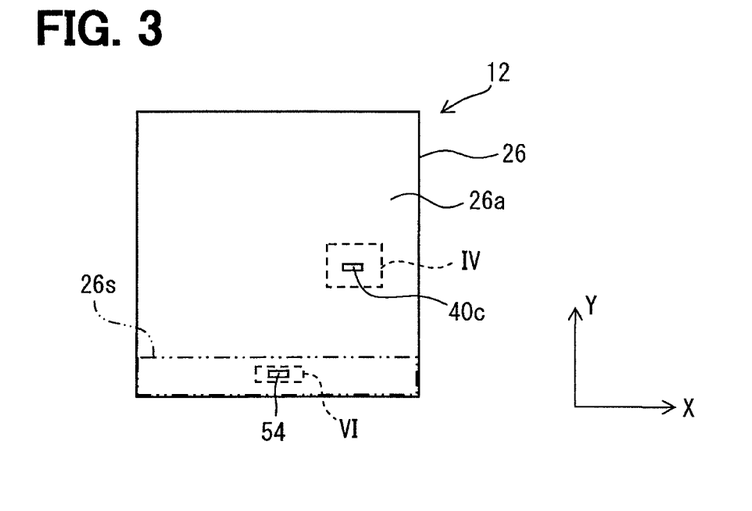
FIG. 3 is a diagram showing a plan view of a printed board of the electronic control apparatus.

The printed board 26 includes an insulated base 38, the wiring pattern 40, and the inspection interrupting portion 54. The insulated base 38 is mainly made of resin material or ceramic material. The wiring pattern 40 is made of conductive material, such as copper. The wiring pattern 40 is disposed on the insulated base 38. The insulated base 38 includes a first surface 38a corresponding to the first surface 26a of the printed board 26 and a second surface 38b corresponding to the second surface 26b of the printed board 26. The wiring pattern 40 is disposed on the first surface 38a of the insulated base 38. As shown in FIG. 3, the printed board 26 has a rectangular shape on the reference plane. The printed board 26 has a first side and a second side perpendicular to the first side. The first side of the printed board 26 is parallel to the direction X, and the second side of the printed board 26 is parallel to the direction Y.

As shown in FIG. 4, the wiring pattern 40, which is disposed on the first surface 38a of the insulated base 38, includes a first wiring portion 40b, a land 40a, and an interrupting portion 40c. The first wiring portion is also referred to as a wiring portion. Each electronic component 28 is mounted on the land 40a by soldering. The interrupting portion 40c is arranged between the land 40a and the first wiring portion 40b. Hereinafter, the wiring pattern 40 excluding the interrupting portion 40c is also referred to as a remaining portion of the wiring pattern 40. Thus, the remaining portion of the wiring pattern 40 includes at least the first wiring portion 40b and the land 40a. As shown in FIG. 4, in the present embodiment, the first wiring portion 40b provides a power supply wire. The power supply wire is also referred to as a power line.

The interrupting portion 40c is a well-known pattern fuse provided by a part of the wiring pattern 40. The interrupting portion 40c melts down by heat generated by an overcurrent in order to interrupt the first wiring portion 40b from the land 40a. That is, the interrupting portion 40c interrupts the overcurrent. The interrupting portion 40c has a width smaller than the remaining portion of the wiring pattern 40. That is, the interrupting portion 40c has the width smaller than a width of the land 40a and a width of the first wiring portion 40b.

In the present embodiment, as shown in FIG. 4, the interrupting portion 40c is arranged in the direction X. Further, a first end of the interrupting portion 40c in the direction X is connected with the land 40a via a first connection wire 40d, and a second end of the interrupting portion 40c in the direction X is connected with the first wiring portion 40b via a second connection wire 40e.

Each of the first connection wire 40d and the second connection wire 40e has different widths in the direction Y. Specifically, as shown in FIG. 4 as an example, the first connection wire 40d has a first width Wd1 adjacent to the interrupting portion 40c and has a second width Wd2 adjacent to the land 40a. The first width Wd1 is a minimum width of the first connection wire 40d, and the second width Wd2 is a maximum width of the first connection wire 40d. Thus, the first width Wd1 is smaller than the second width Wd2. Further, the first width Wd1 of the first connection wire 40d is greater than the width Wc of the interrupting portion 40c. In the present embodiment, the first connection wire 40d has a stepwised shape on the reference plane, and includes a first portion having the first width Wd1 and a second portion having the second width Wd2.

The second connection wire 40e has a similar configuration with the first connection wire 40d. Specifically, the second connection wire 40e has a first width We1 adjacent to the interrupting portion 40c and has a second width We2 adjacent to the first wiring portion 40b. The first width We1 is a minimum width of the second connection wire 40e, and the second width We2 is a maximum width of the second connection wire 40e. Thus, the first width We1 is smaller than the second width We2. Further, the first width We1 of the second connection wire 40e is greater than the width Wc of the interrupting portion 40c. The second connection wire 40e has a stepwised shape on the reference plane, and includes a first portion having the first width We1 and a second portion having the second width We2.

For example, the wiring pattern 40 having above-described structure is formed by patterning a copper foil and performing a copper plating on the patterned copper foil. The wiring pattern 40 may be formed by a method different from the example described above. For example, the wiring pattern 40 may be formed by a screen printing.

Further, a material that easily melts down by heat may be properly used for the interrupting portion 40c so that the interrupting portion 40c melts down more easily than the remaining portion of the wiring pattern 40. For example, the interrupting portion 40c of the wiring pattern 40 may be formed by screen printing of aluminum series material, and the remaining portion of the wiring pattern 40 may be formed by patterning the copper foil. Aluminum has a melting point of 660 Celsius degrees (° C.), and an electric resistivity (unit: $\Omega$m) of $2.65 \times 10^{-8}$. Copper has a melting point of 1085° C., and an electric resistivity (unit: $\Omega$m) of $1.68 \times 10^{-8}$. Since aluminum has the lower melting point than copper and the higher electric resistivity than copper, aluminum is appropriated to be used as the material of the interrupting portion 40c.

Further, the interrupting portion 40c of the wiring pattern 40 may be formed by screen printing of iron series material, and the remaining portion of the wiring pattern 40 may be formed by patterning the copper foil. Further, the interrupting portion 40c of the wiring pattern 40 may be provided by a metal strip made of iron series material, and the remaining portion of the wiring pattern 40 may be formed by performing an electroless copper plating on the first surface 38a of the insulated base 38. Then, an electrolytic copper plating is performed on the electroless copper plated portion and the metal strip to form the wiring pattern 40 finally. Iron has a melting point of 1535° C., and an electric resistivity (unit: Ωm) of $10.0 \times 10^{-8}$. Iron has the higher melting point than copper, and has the higher electric resistivity than copper. Thus, when the interrupting portion 40c is made of iron, a boundary portion between the interrupting portion 40c and the first connection wire 40d or the second connection wire 40e may be maintained at a temperature lower than the melting point of copper, and the interrupting portion 40c may be maintained at a temperature equal to or higher than the melting point of iron.

Figure 5:
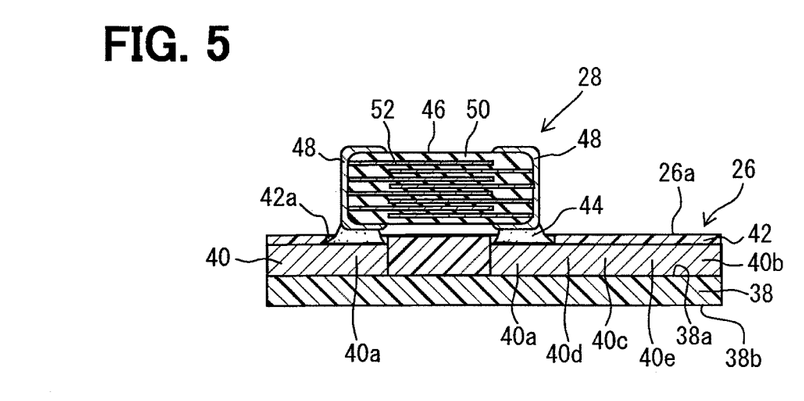
FIG. 5 is a diagram showing a cross-sectional view of the printed board in a line V-V in FIG. 3.

As shown in FIG. 5, the resist 42 is arranged on the first surface 38a of the insulated base 38 so that the wiring pattern 40 is sealed by the resist 42. The resist 42 has an opening 42a at a predetermined position, and a part of the wiring pattern 40 exposed from the opening 42a provides the land 40a of the wiring pattern 40 so that the electronic component 28 is electrically connected with the land 40a via the solder.

As shown in FIG. 5, the electronic component 28 electrically connected with the interrupting portion 40c via the land 40a has a main body 46 and two electrodes 48. As shown in FIG. 5, in the present embodiment, the electronic component 28 is provided by a laminated ceramic capacitor.

As shown in FIG. 5, the main body 46 of the laminated ceramic capacitor has dielectric layers 50 and conductor layers 52, which are alternatively arranged so that each dielectric layer 50 is sandwiched by two conductor layers 52 and each conductor layer 52 is sandwiched by two dielectric layers 50. The dielectric layers 50 are made of high dielectric ceramic of barium titanate series. Each electrode 48 arranged partially surrounding the main body 46 is electrically connected with the conductor layers 52.

The conductor layers 52 function as an internal electrode, and the electrodes 48 function as an external electrode. In the present embodiment, each electronic component 28 has multiple electrodes 48. As shown in FIG. 5, the electronic component 28 has two electrodes 48 arranged at respective longitudinal ends of the main body 46. One of the two electrodes 48 is electrically connected with the land 40a that is connected with the interrupting portion 40c. The other one of the two electrodes 48 is electrically connected with the land 40a that is not connected with the interrupting portion 40c.

The following will describe the inspection interrupting portion 54 of the printed board 26 in details.

As shown in FIG. 6, the printed board 26 includes the inspection interrupting portion 54. The inspection interrupting portion 54 is an alternative component of the interrupting portion 40c, and a current is applied to the inspection interrupting portion 54 for an inspection purpose. The inspection interrupting portion 54 is disposed in order to assure the interrupting performance of the interrupting portion 40c. More specifically, the inspection interrupting portion 54 is provided by a dummy wiring pattern and does not have an electrical connection with other portions including the wiring pattern 40 and the electronic components 28. The inspection interrupting portion 54 is disposed at least one of the first surface 38a and the second surface 38b of the insulated base 38. The inspection interrupting portion 54 is made of the same material with the interrupting portion 40c, and has the same pattern with the interrupting portion 40c.

In the present embodiment, as shown in FIG. 3 and FIG. 6, the inspection interrupting portion 54 is disposed on the first surface 38a of the insulated base 38 together with the interrupting portion 40c. Specifically, as shown in FIG. 3, the inspection interrupting portion 54 is disposed in a redundant area 26s of the first surface 26a of the printed board 26. In the redundant area 26s, the wiring pattern 40 is not formed, and the pins 30a of the connector 30 are connected with the printed board 26 in the redundant area 26s. Further, the inspection interrupting portion 54 is formed by patterning a copper foil, and copper plating is performed on the patterned copper foil. Similar to the interrupting portion 40c, the inspection interrupting portion 54 is arranged in the direction X. The inspection interrupting portion 54 has the same width with the interrupting portion 40c in the direction Y, and has the same length with the interrupting portion 40c in the direction X. As described above, the inspection interrupting portion 54 has an extending direction parallel to an extending direction of the interrupting portion 40c.

At two longitudinal ends of the inspection interrupting portion 54, two pads 56 for applying an inspection current are arranged. The inspection interrupting portion 54 is electrically separated from the wiring pattern 40. That is, the inspection interrupting portion 54 can be inspected separately from the wiring pattern 40. The inspection interrupting portion 54 is connected with the pads 56 via respective connection portions 58. One of the connection portions 58 is made of the same material with the first connection wire 40d, and has the same pattern with the first connection wire 40d. The other one of the connection portions 58 is made of the same material with the second connection wire 40e, and has the same pattern with the second connection wire 40e. Thus, each connection portion 58 has a stepwised shape.

Each pad 56 has a rectangular shape on the reference plane, and has a width greater than a maximum width of the corresponding connection portion 58. The pads 56 are made of the same material with the inspection interrupting portion 54. That is, in the present embodiment, similar to the interrupting portion 40c, the inspection interrupting portion 54, the connection portions 58, the pads 56 are formed by patterning the copper foil and copper plating is performed on the patterned copper foil.

The following will describe an inspection method of the printed board 26, more specifically, an inspection method of the interrupting portion 40c of the wiring pattern 40 with the inspection interrupting portion 54.

In the inspection, the two pads 56 are contacted with respective probe pins (not shown) in order to apply the inspection current to the inspection interrupting portion 54. Then, the interrupting performance of the interrupting portion 40c is inspected by alternatively inspecting whether the inspection interrupting portion 54 melts down when the inspection current is applied to the inspection interrupting portion 54.

Figure 7:
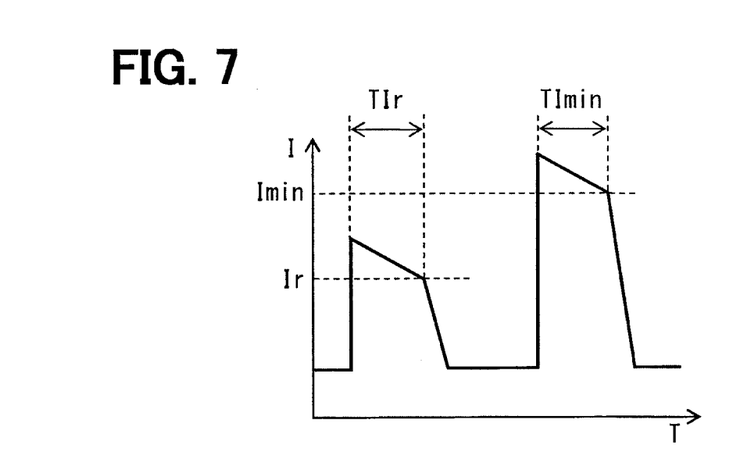
FIG. 7 is a diagram showing an inspection method of the printed board.

In the present embodiment, a pulse current is applied to the inspection interrupting portion 54 as the inspection current. In a first inspection process, as shown in FIG. 7, a rated current Ir is applied to the inspection interrupting portion 54 for a predetermined time period (TIr). The inspection interrupting portion 54 does not melt down in the first inspection process when the inspection interrupting portion 54 satisfies a requirement in a width and a thickness.

When the inspection interrupting portion 54 does not melt down in the first inspection process, a minimum interrupting current Imin is applied to the inspection interrupting portion 54 for a predetermined time period (TImin) in a second inspection process. The minimum interrupting current Imin is greater than the rated current Ir, and is also referred to as a first interrupting current. The predetermined time period for applying the rated current Ir is set equal to the predetermined time period for applying the minimum interrupting current Imin. The minimum interrupting current Imin is a minimum current that causes a meltdown of the inspection interrupting portion 54 when applied for the predetermined time period. Thus, the inspection interrupting portion 54 melts down in the second inspection process when the inspection interrupting portion 54 has the required width and the required thickness.

The inspection interrupting portion 54 is made of the same material with the interrupting portion 40c, and has the same pattern with the interrupting portion 40c. Thus, the width in the direction Y, the length in the direction X, and the thickness of the inspection interrupting portion 54 are approximately equal to the width, the length, and the thickness of the interrupting portion 40c, respectively. Accordingly, the interrupting performance of the interrupting portion 40c may be assured by inspecting the inspection interrupting portion 54. Herein, the inspecting of the inspection interrupting portion 54 means applying the inspection currents to the inspection interrupting portion 54. Thus, the inspection performed to the inspection interrupting portion 54 is also referred to as a current applying inspection.

The following will describe advantages provided by the present embodiment.

As described above, in the present embodiment, the printed board 26 includes the interrupting portion 40c and the inspection interrupting portion 54. The inspection interrupting portion 54 is made of the same material with the interrupting portion 40c, and has the same pattern with the interrupting portion 40c. Further, the inspection interrupting portion 54 is formed so that the width in the direction Y, the length in the direction X, and the thickness of the inspection interrupting portion 54 are approximately equal to the width, the length, and the thickness of the interrupting portion 40c. Thus, in the interrupting portion 40c, a width variation and a thickness variation, which are generated in a manufacturing process, are inspected by performing the current applying inspection to the inspection interrupting portion 54. Thus, the interrupting performance of the interrupting portion 40c is assured with a high precision.

For example, under a condition that the inspection interrupting portion 54 has a width equal to the required width, and has a thickness smaller than a minimum thickness within a predetermined allowable range, the inspection interrupting portion 54 melts down when the rated current Ir is applied for the predetermined time period. Further, under a condition that the inspection interrupting portion 54 has a width equal to the required width, and has a thickness greater than a maximum thickness within the predetermined allowable range, the inspection interrupting portion 54 does not melt down even when the minimum interrupting current Imin is applied for the predetermined time period. Thus, the interrupting performance of the interrupting portion 40c is assured by performing the current applying inspection to the inspection interrupting portion 54.

Further, in the above-described inspection method, a necessary time for the inspection and an inspection cost are reduced compared with a case in which the optical visual inspection apparatus and the thickness measuring apparatus are used for the inspection.

In the present embodiment, the inspection interrupting portion 54 is disposed together with the interrupting portion 40c on the first surface 38a of the insulated base 38. Thus, a thickness variation generated in a manufacturing process between the inspection interrupting portion 54 and the interrupting portion 40c can be further reduced. Thus, the interrupting performance of the interrupting portion 40c can be assured with a high precision.

In the present embodiment, the interrupting portion 40c and the inspection interrupting portion 54 extend in the same direction. Thus, the thickness variation generated in a manufacturing process between the inspection interrupting portion 54 and the interrupting portion 40c can be further reduced. Thus, the interrupting performance of the interrupting portion 40c can be assured with a high precision.

In the present embodiment, the pads 56 are arranged at two longitudinal ends of the inspection interrupting portion 54, and the inspection interrupting portion 54 is electrically separated from the wiring pattern 40. Thus, the current applying inspection can be easily performed to the inspection interrupting portion 54 by contacting the probe pins of an external current source to the respective pads 56.

In the present embodiment, the inspection interrupting portion 54 is arranged in the redundant area 26s of the first surface 26a of the printed board 26. The redundant area 26s is an area in which he wiring pattern 40 is not formed. Thus, a size of the printed board 26 can be reduced by arranging the inspection interrupting portion 54 in the redundant area 26s compared with a case in which the inspection interrupting portion 54 is arranged in an area other than the redundant area 26s.

In the present embodiment, the interrupting portion 40c is electrically connected with the first wiring portion 40b, which provides the power supply wire, via the second connection wire 40e. Further, the interrupting performance of the interrupting portion 40c is assured by performing the current applying inspection to the inspection interrupting portion 54. Thus, when a short circuit occurs in the electronic component 28 and an overcurrent flows through the interrupting portion 40c, the interrupting portion 40c melts down, and the overcurrent is interrupted by the meltdown of the interrupting portion 40c. Thus, other electronic components 28 connected to the first wiring portion 40b (power supply wire) are protected from the overcurrent. Further, the overcurrent that is interrupted by the interrupting portion 40c is not high enough to cause a meltdown of the fuse 34. Thus, power supply to other electronic control apparatuses are not affected by the overcurrent.

In the present embodiment, the electronic components 28 include the laminated ceramic capacitor. When the electronic component 28 having a laminated structure, a size of the electronic component 28 can be reduced, and a high-density mounting on the circuit board 12 can be achieved. However, in the electronic component 28 having the laminated structure, a short circuit is easy to be occurred among the conductor layers 52 having laminated-layer structure caused by a shake of the vehicle or a thermal stress. In the present embodiment, when the short circuit occurs in the laminated electronic component 28, the interrupting portion 40c promptly interrupts the overcurrent.

Suppose that the battery 36 is provided by a lithium battery, as well known, a lithium battery has an improved current supply capability than a lead battery. However, when the lithium battery supplies a current higher than a rated current, the lithium battery rapidly deteriorates. In the present embodiment, when the overcurrent is generated in the electronic component 28, the overcurrent is interrupted by the interrupting portion 40c. Thus, an abnormal effect to the battery 36 caused by the overcurrent is reduced to a minimum degree.

In the present embodiment, single inspection interrupting portion 54 is disposed on the printed board 26. Further, more than one inspection interrupting portions 54 may be disposed on the printed board 26. More than one inspection interrupting portions 54 may be disposed on the printed board 26 corresponding to more than one interrupting portions 40c having different shapes or different thicknesses.

In the present embodiment, the inspection interrupting portion 54 is arranged in the redundant area 26s. Further, the inspection interrupting portion 54 may be arranged in an area other than the redundant area 26s. That is, the inspection interrupting portion 54 may be arranged in an area where the wiring pattern 40 is disposed. When the inspection interrupting portion 54 is arranged in the redundant area 26s, the size of the printed board 26 can be reduced.

(Second Embodiment)

In the present embodiment, a similar part with the first embodiment in the printed board 26, the electronic control apparatus 10, and the inspection method of the printed board 26 will be omitted.

Figure 9:
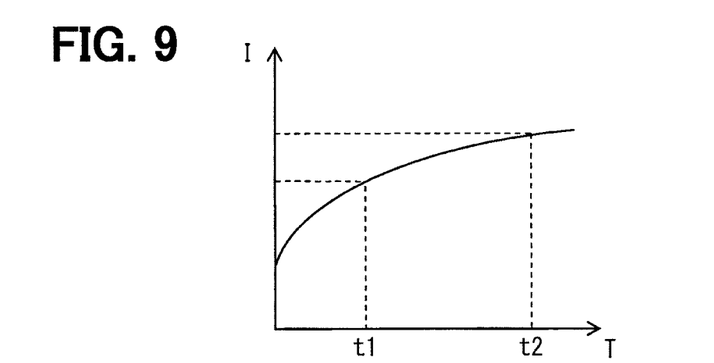
FIG. 9 is a diagram showing an inspection method of the printed board.

As shown in FIG. 9, in the present embodiment, the interrupting performance of the interrupting portion 40c is considered to be assured when the inspection interrupting portion 54 does not melt down after an elapse of a first time period t1 and the inspection interrupting portion 54 melts down after an elapse of a second time period t2 that is longer than the first time period t1. Herein, a reference time (start time) to determine the elapse of the first time and the second time is a time at which the inspection current is applied to the inspection interrupting portion 54.

Figure 8:
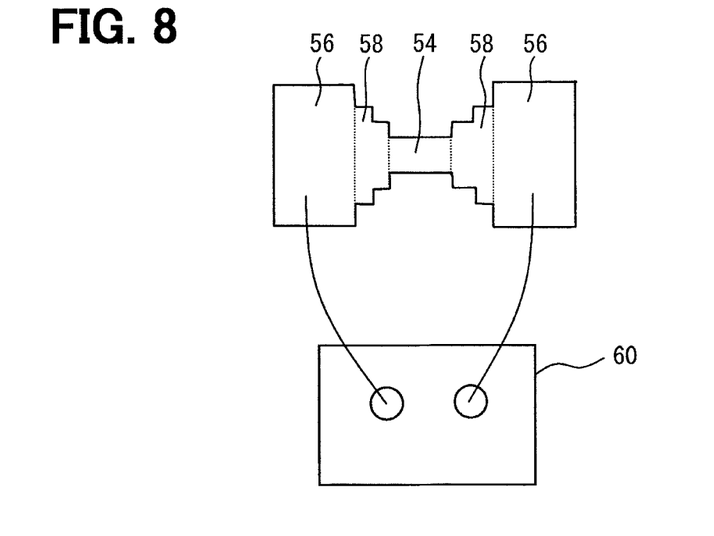
FIG. 8 is a diagram showing a printed board according to a second embodiment when a current source is connected to the printed board.

As shown in FIG. 8, a constant current source 60 is connected to the pads 56 of the inspection interrupting portion 54 at the start time. Then, as shown in FIG. 9, the current I applied to the inspection interrupting portion 54 increases over time T. When the first time period t1 elapses from the start time, the inspection interrupting portion 54 satisfying required performance does not melt down. When the second time period t2 (t 2>t1) elapses from the start time, the inspection interrupting portion 54 satisfying required performance melts down. In the present embodiment, the current applied to the inspection interrupting portion 54 after the elapse of the first time period t1 is greater than the current applied to the inspection interrupting portion 54 during the first time period t1.

For example, under a condition that the inspection interrupting portion 54 has a width equal to the required width and has a thickness smaller than the minimum thickness within the predetermined allowable range, the inspection interrupting portion 54 melts down when the first time period t1 elapses from the start time. Further, under a condition that the inspection interrupting portion 54 has a width equal to the required width and has a thickness greater than the maximum thickness within the predetermined allowable range, the inspection interrupting portion 54 does not melt down even when the second time period t2 elapses from the start time. Thus, the interrupting performance of the interrupting portion 40c is assured by performing the current applying inspection to the inspection interrupting portion 54.

Further, as shown in FIG. 8, the constant current source 60 is connected to the pads 56 of the inspection interrupting portion 54. Further, a constant voltage source may be connected to the pads 56 of the inspection interrupting portion 54, and a supply voltage of the constant voltage source may be gradually increased over time so that a current applied to the inspection interrupting portion 54 gradually increases.

(Modification)

Figure 10:
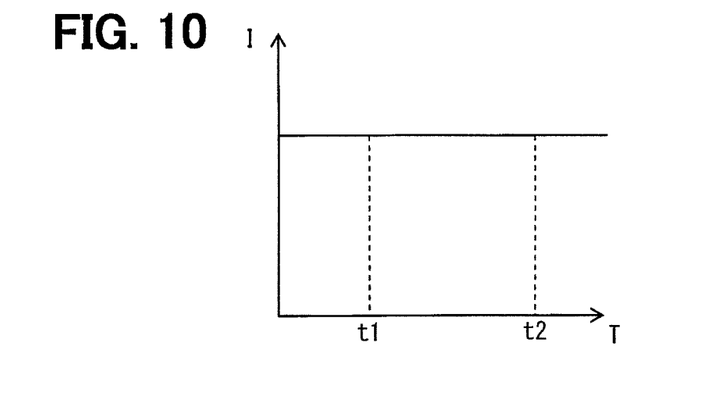
FIG. 10 is a diagram showing an inspection method according to a modification of the present disclosure.

In the second embodiment, the current applied to the inspection interrupting portion 54 increases over time as shown in FIG. 8. Further, the current applied to the inspection interrupting portion 54 may be a constant current higher than the rated current Ir. Heat Q generated by current I flowing through a resistor R can be represented by an expression $Q=I^2 \times R \times t$. Thus, as shown in FIG. 10 under a condition that the constant current is applied to the inspection interrupting portion 54, when the first time period t1 elapses from the start time, the inspection interrupting portion 54 satisfying required performance does not melt down, and when the second time period t2 (t2>t1) elapses from the start time, the inspection interrupting portion 54 satisfying required performance melts down.

(Third Embodiment)

In the present embodiment, a similar part with the foregoing embodiments in the printed board 26 and the inspection method of the printed board 26 will be omitted.

Figure 11:
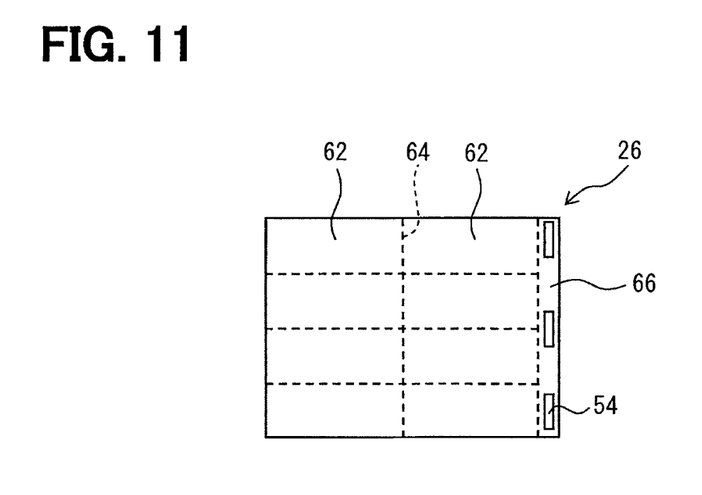
FIG. 11 is a diagram showing a plan view of a printed board according to a third embodiment of the present disclosure.

In the present embodiment, as shown in FIG. 11, the insulated base 38 is divided into multiple circuit areas 62 by, for example, router cutting. The multiple circuit areas 62 are separated from one another. The wiring pattern 40 having the interrupting portion 40c is disposed in each of the circuit areas 62. In FIG. 11, a cutting line 64 of the router cutting is shown by a dashed line. As shown in FIG. 11, the printed board 26 is divided into eight circuit areas 62 by cutting the printed board 26 with the router.

In the insulated base 38, the inspection interrupting portion 54 is disposed in an area 66 that is different from the circuit areas 62 and is remained after the router cutting. The area 66 that is a remaining part after a division of the insulated base 38 into the circuit areas 62 is also referred to as a redundant area 66. In the present embodiment, the insulated base 38 functions as a work board, and the inspection interrupting portion 54 is disposed in the redundant area 66 of the work board. Further, as shown in FIG. 11, three different inspection interrupting portions 54 are disposed in the redundant area 66 of the printed board 26.

With above-described configuration, the interrupting performances of the interrupting portions 40c of the wiring patterns 40 that are disposed in respective circuit areas 62 are inspected by performing the current applying inspection to the inspection interrupting portion 54 by one time. Thus, the number of inspection times can be reduced.

In the present embodiment, the number of the circuit areas 62 is not limited to eight. The number of the circuit areas 62 may be set other than eight. Further, the number of the inspection interrupting portions 54 is not limited to three. The number of the inspection interrupting portions 54 may be set other than three.

(Fourth Embodiment)

In the present embodiment, a similar part with the foregoing embodiments in the printed board 26, the electronic control apparatus 10, and the inspection method of the printed board 26 will be omitted.

Figure 12:
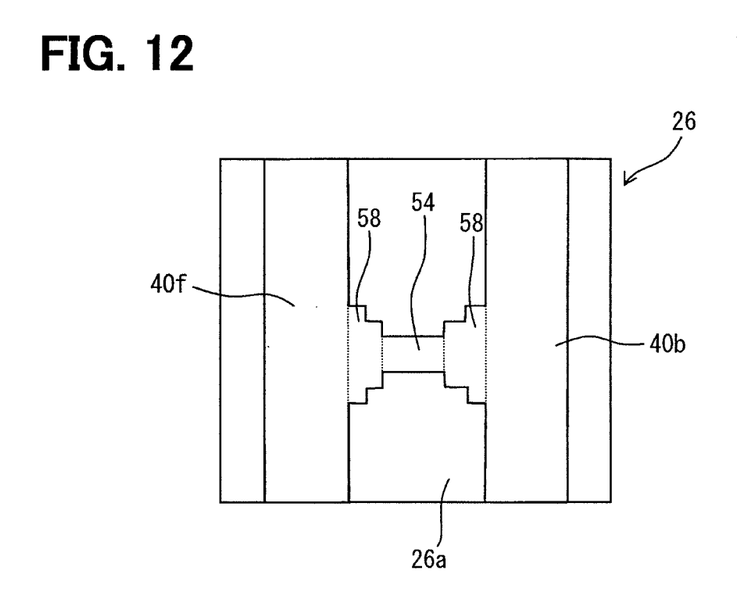
FIG. 12 is a diagram showing an enlarged plan view of a surrounding portion of an inspection interrupting portion in a printed board according to a fourth embodiment of the present disclosure.

In the present embodiment, the inspection interrupting portion 54 is electrically connected between two predetermined portions of the wiring pattern 40, which have different potentials and conduct a current higher than the current flowing the interrupting portion 40c. FIG. 12 shows an example of the inspection interrupting portion 54 disposed between two predetermined portions of the wiring pattern 40 having different potentials. Specifically, one end of the inspection interrupting portion 54 is connected to the first wiring portion 40b that provides the power supply wire via a connection portion 58, and the other end of the inspection interrupting portion 54 is connected to a ground wire 40f via another connection portion 58.

When the pins 30a of the connector 30 are connected to the battery 36 via the external connector and the wiring harness, the circuit including the wiring pattern 40 and the electronic components 28 receives a power supply from the battery 36. When the power is supplied to the circuit, the current flowing through the inspection interrupting portion 54 increases over time during a predetermined period as shown in FIG. 9. Thus, similar to the second embodiment, in the present embodiment, when the first time period t1 elapses from the start time at which the battery is connected to the circuit, the inspection interrupting portion 54 satisfying required performance does not melt down. Further, when the second time period t2 (t2>t1) elapses from the start time, the inspection interrupting portion 54 satisfying required performance melts down. Thus, the interrupting performance of the interrupting portion 40c is assured by performing the current applying inspection to the inspection interrupting portion 54.

Further, different from the wiring pattern 40, a purpose of disposing the inspection interrupting portion 54 is not providing an electrical connection. Thus, a meltdown of the inspection interrupting portion 54 does not affect a performance of the circuit. Further, when the battery 36 is connected to the circuit, the current applied to the interrupting portion 40c is lower than the current applied to the inspection interrupting portion 54. Thus, the interrupting portion 40c does not melt down when the battery is connected to the circuit.

In the present embodiment, when the power source (battery 36) is supplied to the circuit board 12, a current applying inspection is performed to the inspection interrupting portion 54. Thus, an additional current source for applying the current to the inspection interrupting portion 54 is not necessary. Further, in the above example in which the inspection interrupting portion 54 is disposed between the first wiring portion 40b (power supply wire) and the ground wire 40f, the current applying inspection can be performed to the inspection interrupting portion 54 even when the electronic components 28 are not mounted on the printed board 26.

In the present embodiment, as an example, the inspection interrupting portion 54 is connected between the first wiring portion 40b (power supply wire) and the ground wire 40f. Further, other than the first wiring portion 40b and the ground wire 40f, the inspection interrupting portion 54 may be electrically connected between two different portions of the wiring pattern 40, which have different potentials and conduct a current higher than the current flowing through the interrupting portion 40c. For example, a current path with respect to the inspection interrupting portion 54 may include an electronic component 28, such as a diode. That is, when the power source 36 is supplied to the circuit, the current applying inspection of the inspection interrupting portion 54 can be directly performed to the electronic control apparatus 10 or the circuit board 12 in a state that the electronic components 28 are mounted on the circuit board 12. Thus, single printed board 26 for performing the current applying inspection is no more necessary.

(Other Embodiments)

In the foregoing embodiments, the laminated ceramic capacitor is described as one example of the electronic component 28. Further, the electronic components 28 may include components other than the laminated ceramic capacitor. For example, the electronic components 28 may include a laminated inductor, a diode, a transistor, or a resistor.

In the foregoing embodiments, the first wiring portion 40b connected to the interrupting portion 40c provides the power supply wire connected to the battery 36. Further, the first wiring portion 40b may be another wiring portion other than the power supply wire.

The inspection interrupting portion 54 may be disposed on a different surface from the surface on which the interrupting portion 40c is disposed. For example, the interrupting portion 40c may be disposed on the first surface 38a of the insulated base 38, and the inspection interrupting portion 54 may be disposed on the second surface 38b of the insulated base 38.

Further, the inspection interrupting portion 54 may extend in a direction different from the direction in which the interrupting portion 40c extends. For example, when the interrupting portion 40c extends in the direction X, the inspection interrupting portion 54 may be arranged to extend in the direction Y.

While only the selected exemplary embodiments have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiments according to the present disclosure is provided for illustration only, and not for the purpose of limiting the disclosure as defined by the appended claims and their equivalents.

What is claimed is:

1. A printed board comprising:
   an insulated base having a first surface and a second surface opposite to the first surface;
   a wiring pattern disposed on the first surface of the insulated base, the wiring pattern including:
      a wiring portion;
      a land on which an electronic component is soldered, the electronic component mounted on the land and the wiring pattern configuring a circuit; and
      an interrupting portion disposed between the wiring portion and the land, the interrupting portion electrically interrupts the wiring portion from the land by melting down under a heat generated by an overcurrent; and
   an inspection interrupting portion disposed on at least one of the first surface or the second surface of the insulated base, the inspection interrupting portion being made of a same material with the interrupting portion and having a same pattern with the interrupting portion,
   wherein, the interrupting portion has a width smaller than a width of a remaining portion that is other than the interrupting portion in the wiring pattern,
   wherein, in order to assure an interrupting performance of the interrupting portion, the inspection interrupting portion is inspected instead of the interrupting portion by applying an inspection current to the inspection interrupting portion,
   wherein the inspection interrupting portion is electrically connected between two different portions of the wiring pattern, and wherein the two different portions of the wiring pattern have different potentials and conduct a current higher than a current flowing through the interrupting portion.

2. The printed board according to claim 1, wherein the inspection interrupting portion together with the interrupting portion are disposed on the first surface of the insulated base.

3. The printed board according to claim 2, wherein the interrupting portion extends in a direction parallel to a direction in which the inspection interrupting portion extends.

4. An electronic control apparatus comprising:
the printed board according to claim 1; and
the electronic component mounted on the land of the printed board by soldering.

5. An inspection method of the printed board according to claim 1 for inspecting the interrupting performance of the interrupting portion, comprising:
performing a current applying inspection to the inspection interrupting portion by applying the inspection current to the inspection interrupting portion;
confirming whether the inspection interrupting portion melts down under the inspection current; and
determining the interrupting performance of the interrupting portion based on a result of the current applying inspection performed to inspection interrupting portion.

6. The inspection method according to claim 5, wherein the current applying inspection includes:
applying a rated current to the inspection interrupting portion as the inspection current for a predetermined time period; and
applying a first interrupting current higher than the rated current to the inspection interrupting portion as the inspection current for the predetermined time period when the inspection interrupting portion does not melt do n after applying the rated current for the predetermined time period.

7. The inspection method according to claim 5, wherein the current applying inspection includes:
applying the inspection current to the inspection interrupting portion until a first time period elapses from a start time at which the inspection current is applied to the inspection interrupting portion; and
applying the inspection current to the inspection interrupting portion until a second time period longer than the first time period elapses from the start time when the inspection interrupting portion does not melt down after the first time period elapses.

8. The inspection method according to claim 5, wherein the inspection interrupting portion is electrically connected between two different portions of the wiring pattern, and the two different portions have different potentials and conduct a current higher than a current flowing through the interrupting portion, and
wherein the current applying inspection includes:
connecting a power source to the circuit including the electronic component and the wiring pattern;
confirming whether the inspection interrupting portion melts down until a first time period elapses from a start time at which the power source is connected to the circuit; and
confirming whether the inspection interrupting portion melts down until a second time period elapses from the start time when the inspection interrupting portion does not melt down after the first time period elapses.

9. An inspection method for inspecting an interrupting performance of an interrupting portion of a printed board, wherein the printed board includes:
an insulated base having a first surface and a second surface opposite to the first surface;
a wiring pattern disposed on the first surface of the insulated base, the wiring pattern including:
a wiring portion;
a land on which an electronic component is soldered, the electronic component mounted on the land and the wiring pattern configuring a circuit; and
the interrupting portion being disposed between the wiring portion and the land, the interrupting portion electrically interrupts the wiring portion from the land by melting down under a heat generated by an overcurrent; and
the inspection interrupting portion disposed on at least one of the first surface or the second surface of the insulated base, the inspection interrupting portion being made of a same material with the interrupting portion and having a same pattern with the interrupting portion,
wherein, the interrupting portion has a width smaller than a width of a remaining portion that is other than the interrupting portion in the wiring pattern, and
wherein, in order to assure an interrupting performance of the interrupting portion, the inspection interrupting portion is inspected instead of the interrupting portion by applying an inspection current to the inspection interrupting portion;
the inspection method comprising:
performing a current applying inspection to the inspection interrupting portion by applying the inspection current to the inspection interrupting portion;
confirming whether the inspection interrupting portion melts down under the inspection current; and
determining the interrupting performance of the interrupting portion based on a result of the current applying inspection performed to inspection interrupting portion.
wherein the current applying inspection includes:
applying a rated current to the inspection interrupting portion as the inspection current for a predetermined time period; and
applying a first interrupting current higher than the rated current to the inspection interrupting portion as the inspection current for the predetermined time period when the inspection interrupting portion does not melt down after applying the rated current for the predetermined time period.

10. An inspection method for inspecting an interrupting performance of an interrupting portion of a printed board, wherein the printed board includes:
an insulated base having a first surface and a second surface opposite to the first surface;
a wiring pattern disposed on the first surface of the insulated base, the wiring pattern including:
a wiring portion;
a land on which an electronic component is soldered, the electronic component mounted on the land and the wiring pattern configuring a circuit; and
the interrupting portion being disposed between the wiring portion and the land, the interrupting portion electrically interrupts the wiring portion from the land by melting down under a heat generated by an overcurrent; and the inspection interrupting portion disposed on at least one of the first surface or the second surface of the insulated base, the inspection interrupting portion being made of a same material with the interrupting portion and having a same pattern with the interrupting portion, wherein, the interrupting portion has a width smaller than a width of a remaining portion that is other than the interrupting portion in the wiring pattern, and wherein, in order to assure an interrupting performance of the interrupting portion, the inspection interrupting portion is inspected instead of the interrupting portion by applying an inspection current to the inspection interrupting portion;

the inspection method comprising:

performing a current applying inspection to the inspection interrupting portion by applying the inspection current to the inspection interrupting portion;

confirming whether the inspection interrupting portion melts down under the inspection current; and determining the interrupting performance of the interrupting portion based on a result of the current applying inspection performed to inspection interrupting portion, wherein the current applying inspection includes:

applying the inspection current to the inspection interrupting portion until a first time period elapses from a start time at which the inspection current is applied to the inspection interrupting portion; and applying the inspection current to the inspection interrupting portion until a second time period longer than the first time period elapses from the start time when the inspection interrupting portion does not melt down after the first time period elapses.

* * * * *